United States Patent
Taniguchi (10) Patent No.: US 8,716,773 B2
(45) Date of Patent: May 6, 2014

(54) DYNAMIC MEMORY DEVICE WITH IMPROVED BITLINE CONNECTION REGION

(76) Inventor: Koji Taniguchi, Tokyo (JP)

( * ) Notice: Subject to any disclaimer, the term of this patent is extended or adjusted under 35 U.S.C. 154(b) by 0 days.

(21) Appl. No.: 13/271,495

(22) Filed: Oct. 12, 2011

(65) Prior Publication Data

US 2012/0086063 A1    Apr. 12, 2012

(30) Foreign Application Priority Data

Oct. 12, 2010 (JP) .................... 2010-229812

(51) Int. Cl.
*H01L 27/108* (2006.01)
(52) U.S. Cl.
CPC .... *H01L 27/10814* (2013.01); *H01L 27/10823* (2013.01); *H01L 27/10897* (2013.01); *H01L 27/10894* (2013.01); *H01L 27/10888* (2013.01)
USPC ............ 257/296; 257/E27.088; 257/E27.091; 257/E27.097
(58) Field of Classification Search
CPC ................... H01L 27/10814; H01L 27/10823; H01L 27/10888; H01L 27/10885; H01L 27/10894
See application file for complete search history.

(56) References Cited

U.S. PATENT DOCUMENTS

| | | | | |
|---|---|---|---|---|
| 7,034,408 B1 * | 4/2006 | Schloesser | ..................... | 257/213 |
| 2008/0296674 A1 * | 12/2008 | Graham et al. | ................ | 257/334 |
| 2009/0239376 A1 * | 9/2009 | Sung et al. | ..................... | 438/643 |
| 2011/0020993 A1 * | 1/2011 | Park et al. | ..................... | 438/275 |
| 2011/0049595 A1 * | 3/2011 | Xiao | .............................. | 257/296 |

FOREIGN PATENT DOCUMENTS

JP    2000-307084 A    11/2000

* cited by examiner

*Primary Examiner* — Julio J Maldonado
*Assistant Examiner* — Molly Reida
(74) *Attorney, Agent, or Firm* — Sughrue Mion, PLLC (57) ABSTRACT

A semiconductor device includes a semiconductor substrate having a memory cell region and a peripheral circuit region; a bit line extending over the memory cell region and the peripheral circuit region, the bit line including a first portion in the peripheral circuit region; and a sense amplifier in the peripheral circuit region. The sense amplifier includes a transistor having a gate electrode which includes the first portion of the bit line.

20 Claims, 5 Drawing Sheets

DYNAMIC MEMORY DEVICE WITH IMPROVED BITLINE CONNECTION REGION

BACKGROUND OF THE INVENTION

1. Field of the Invention

The present invention generally relates to a semiconductor device.

Priority is claimed on Japanese Patent Application No. 2010-229812, filed Oct. 12, 2010, the content of which is incorporated herein by reference.

2. Description of the Related Art

The gate electrode of a memory cell selection transistor of a DRAM is integrally formed with a word line. A laminated structure of a polycrystalline silicon layer, a barrier metal layer, and a metal layer (hereinafter refer to as a polymetal structure) is known as a word line that includes the gate electrode. A laminated structure of a Ti layer, a TiN layer, and a W layer or the like (hereinafter referred to as a metal structure) are known as a bit line of a transistor. For example, Japanese Unexamined Patent Application, First Publication, No. JPA 2000-307084 discloses a memory cell including a word line having a poly-metal structure formed on a semiconductor substrate surface, a bit line having a metal structure formed over the word line, and a capacitor further formed over the bit line.

The third embodiment of Japanese Unexamined Patent Application, First Publication, No. JPA 2000-307084 discloses the constitution of a peripheral circuit that is a sense amplifier, wherein the gate electrode of a transistor of the peripheral circuit has one and the same polymetal structure as the word line of the memory cell, and is formed by the same process step.

Also, there is a description of a bit line of a memory having a metal structure extending up to the peripheral circuit, and connection being made to a gate electrode or a source/drain diffusion region of the peripheral circuit transistor via a contact plug.

In the configuration of Japanese Unexamined Patent Application, First Publication, No. JPA 2000-307084, because the bit line of the memory cell is formed at a position that is higher than the transistor of the peripheral circuit, a contact plug is necessary for the connection between the bit line and the transistor of the peripheral circuit.

SUMMARY

In one embodiment, a semiconductor device may include, but is not limited to, a semiconductor substrate having a memory cell region and a peripheral circuit region, the memory cell region having a groove. A first insulating film is disposed on an inner wall of the groove. A buried word line extends on the first insulating film and in the groove. A second insulation film buries the buried word line and that is in the groove. A diffusion region is disposed in the memory cell region. The diffusion region is adjacent to the groove. A bit line is coupled to the diffusion region. The bit line extends over the memory cell region and the peripheral circuit region. The bit line may include, but is not limited to, a first portion in the peripheral circuit region. A sense amplifier is disposed in the peripheral circuit region. The sense amplifier may include, but is not limited to, a transistor having the first portion of the bit line as a gate electrode.

In another embodiment, a semiconductor device may include, but is not limited to, a semiconductor substrate having a memory cell region and a peripheral circuit region. A plurality of memory cells is provided in the memory cell region. Each memory cell may include, but is not limited to, a cell transistor and a capacitor coupled to the cell transistor. A plurality of buried word lines is connected to the plurality of memory cells. A plurality of bit lines is connected to the plurality of memory cells. The plurality of bit lines extends over the memory cell region and a peripheral circuit region. A plurality of sense amplifiers is provided in the peripheral circuit region. Each sense amplifier may include, but is not limited to, a transistor having a portion of the bit line as a gate electrode.

In still another embodiment, a semiconductor device may include, but is not limited to, a semiconductor substrate having a memory cell region and a peripheral circuit region; a bit line extending over the memory cell region and the peripheral circuit region, the bit line including a first portion in the peripheral circuit region; and a sense amplifier in the peripheral circuit region. The sense amplifier includes a transistor having a gate electrode which includes the first portion of the bit line.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail with reference to FIG. 5, in order to facilitate the understanding of the present invention.

With advances in microstructuring of DRAMs, in the case of using a planar transistor as described in Japanese Unexamined Patent Application, First Publication, No. JPA 2000-307084 as a memory cell selection transistor, it has become difficult to suppress leakage current between the source/drain diffusion layers because of the short-channel effect. To suppress this short-channel effect, development of a buried word line type transistor such as shown in FIG. 5 is progressing.

Figure 5:
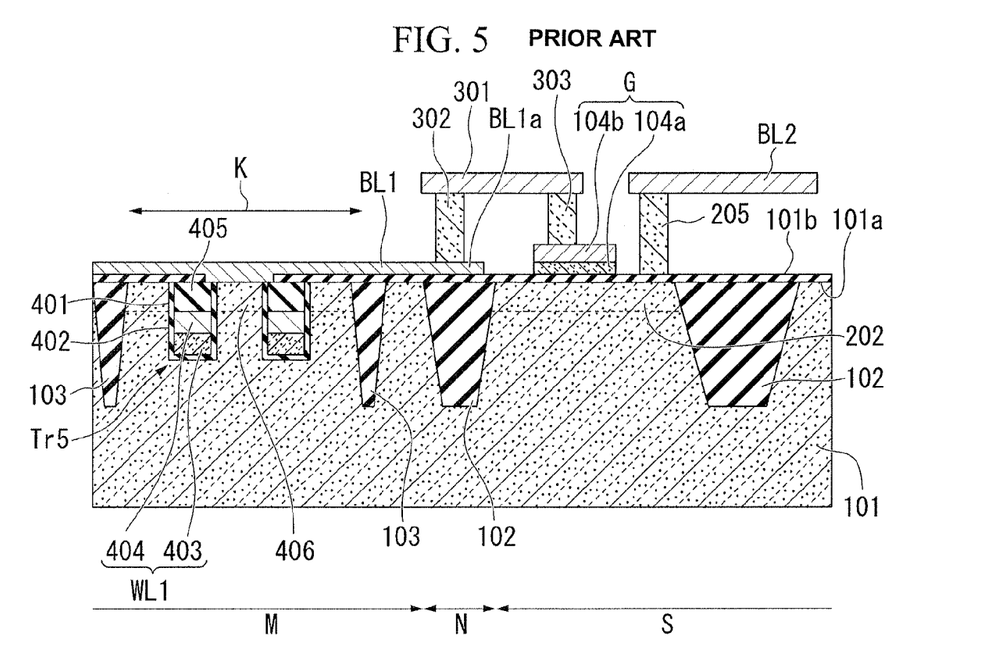
FIG. 5 is a fragmentary cross sectional elevation view of a semiconductor device, taken along a Z-Z' line of FIG. 6, in accordance with related art.
Figure 6:
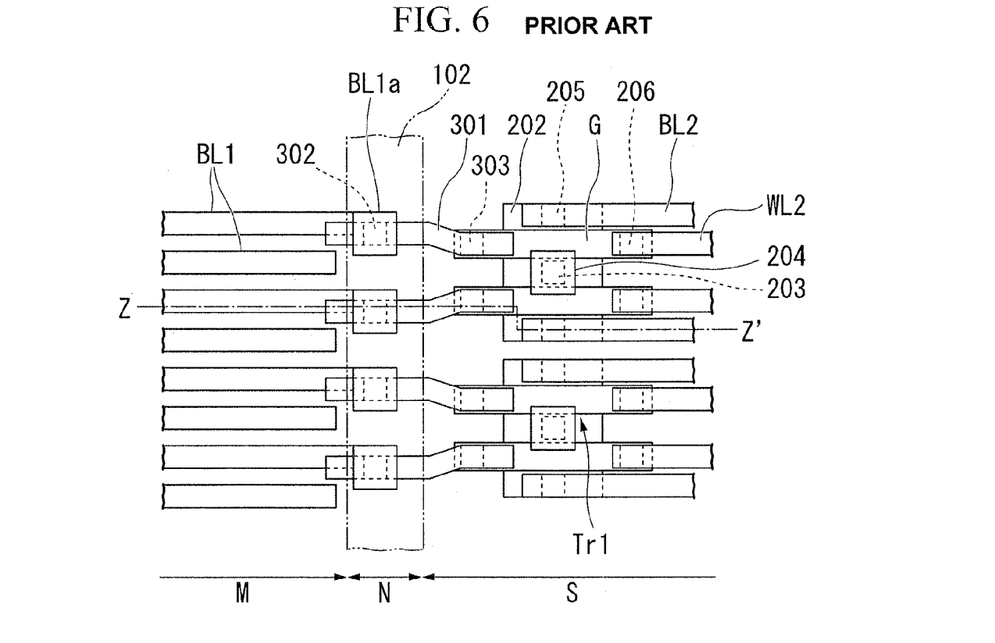
FIG. 6 is a fragmentary plan view of the semiconductor device of FIG. 5.

FIG. 5 is a schematic representation of the cross-section of a semiconductor device having a DRAM element in a memory cell region. FIG. 6 is a schematic plan view of the semiconductor device. FIG. 5 is a cross-sectional view along the line Z-Z' in FIG. 6.

The semiconductor device shown in FIG. 5 and FIG. 6 is an example in which a word line WL1 is buried in a semiconductor substrate 101, and a bit line BL1 is formed over one surface 101a of the semiconductor substrate 101. That is, in the semiconductor device shown in FIG. 5 and FIG. 6, the memory cell region M and the peripheral circuit region S are provided, a memory cell region M and a peripheral circuit region S being partitioned by a first element separation region 102 provided in the boundary region N. The memory cell region M is provided with an active region K made of a semiconductor substrate partitioned by a second element separation region 103, a word line WL1 buried inside a trench formed in the active region K, an impurity diffusion region 406 formed in the active region K, and a first bit line BL1 formed in a direction that intersects with the active region K. Part of the word line WL1 serves as the gate electrode and, together with the impurity diffusion region 406, this gate electrode forms the memory cell selection transistor of the DRAM element. The end part BL1a of the first bit line BL1 extends up to the boundary region N.

More specifically, the buried word line type transistor Tr5 shown in FIG. 5 is constituted by a trench 401 formed in the semiconductor substrate 101, a gate insulating film 402 formed so as to cover the inner surface of the trench, a gate electrode (word line WL1) formed so as to make contact with the gate insulating film 402 and bury downward in the trench, a buried insulating film 405 that is formed to bury upward in the trench 401 so as to cover the gate electrode, and source/drain diffusion layers 406 that are formed on the semiconductor substrate surface on each side sandwiching the trench 401. With this constitution, because the channel part of the transistor corresponds to the surface of the trench 401, it is possible to expand the effective length thereof and suppress the short-channel effect.

In the above-noted buried word line type transistor Tr5, because the word line WL1 is buried into the inside of the trench 401, it is not exposed above the surface of the semiconductor substrate 101. The bit line BL1 is therefore positioned on the surface of the semiconductor substrate 101 within the memory cell.

In this type of constitution, when the polymetal structure disclosed in Japanese Unexamined Patent Application, First Publication, No. JPA 2000-307084 is applied to the word line, a metal structure is applied to the bit line, and poly-metal structure gate electrode is used as a transistor in the peripheral circuit, as shown in FIG. 5, the poly-metal structure word line made of the polysilicon 403 and the metal 404 is buried within the trench, and a bit line having a metal structure is disposed on the semiconductor substrate surface via an insulating film 101b.

On the surface of the semiconductor substrate of the peripheral circuit, a poly-metal structure gate electrode G made of the polysilicon 104a and the metal 104b is formed, via the insulating film 101b.

A MOS transistor Tr1 forming part of a sense amplifier is provided in the peripheral circuit region S. This MOS transistor Tr1 is constituted by a gate electrode G made of a poly-metal structure, and an impurity diffusion region 202 formed over the semiconductor substrate 101 on both sides of gate electrode G in the length direction. A first contact plug 203 is connected to the impurity diffusion region 202, and the first contact plug 203 is connected to an interconnect layer 204 thereabove. A second contact plug 205 is connected to the impurity diffusion region 202, and the second contact plug 205 is connected to a second bit line BL2. Also, the gate electrode G is connected to a peripheral word line WL2, via a third contact plug 206.

As noted above, the first bit line BL1 of the memory cell region M has a metal structure and the gate electrode G of the peripheral circuit region S has a polymetal structure. Because the first bit line BL1 and the gate electrode G are made of different materials in this manner, it is not possible to directly connect the first bit line BL1 and the gate electrode G, and the approach of connecting the first bit line BL1 with the gate electrode G via an connecting interconnect 301 is unavoidable.

That is, a connecting interconnect 301 is formed in a part of the region of the semiconductor substrate from the boundary region N on one surface 101a up to the peripheral circuit region S. The connecting interconnector 301 is formed on a layer that is higher than the first bit line BL1 on the semiconductor substrate 101 and the gate electrode G. The memory cell region M side of the connecting interconnect 301 is connected to the first bit line BL1 via a fourth contact plug 302, and the peripheral circuit region S side of the connecting interconnect 301 is connected to the gate electrode G via a fifth contact plug 303.

With the semiconductor device shown in FIG. 5 and FIG. 6, however, space is necessary to provide the connecting interconnect 301 and the fourth and fifth contact plugs 302 and 303, making it necessary to reserve a large space as the boundary region N. For this reason, it is difficult to achieve a saving of semiconductor device space, thereby hindering the achievement of microstructuring. Also, because a metal structure bit line is formed on the surface of the semiconductor substrate, there are cases in which an abnormal silicide reaction occurs between the metal that forms the contact for the bit line to the semiconductor substrate surface and the semiconductor substrate, this causing the problem of junction leakage current in the source/drain diffusion layer.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a semiconductor substrate having a memory cell region and a peripheral circuit region, the memory cell region having a groove. A first insulating film is disposed on an inner wall of the groove. A buried word line extends on the first insulating film and in the groove. A second insulation film buries the buried word line and is in the groove. A diffusion region is disposed in the memory cell region. The diffusion region is adjacent to the groove. A bit line is coupled to the diffusion region. The bit line extends over the memory cell region and the peripheral circuit region. The bit line may include, but is not limited to, a first portion in the peripheral circuit region. A sense amplifier is disposed in the peripheral circuit region. The sense amplifier may include, but is not limited to, a transistor having the first portion of the bit line as a gate electrode.

In some cases, the gate electrode may include, but is not limited to, a polysilicon film.

In some cases, the buried word line may include, but is not limited to, an inner layer in contact with the first insulating film; and a refractory metal layer in contact with the inner layer.

In some cases, the inner layer may include, but is not limited to, titanium nitride. The refractory metal layer may include, but is not limited to, tungsten.

In some cases, the bit line may include, but is not limited to, a bottom conductive film of polysilicon; and a metal film on the bottom conductive film.

In some cases, the metal film may include, but is not limited to, tungsten silicide.

In some cases, the metal film may include, but is not limited to, tungsten nitride.

In some cases, the metal film may include, but is not limited to, tungsten.

In some cases, the semiconductor device may further include, but is not limited to, a third insulating film over the bit line.

In some cases, the semiconductor device may further include, but is not limited to, a first interlayer insulating film and a contact plug. The first interlayer insulating film is disposed over the semiconductor substrate in the memory cell region. The first interlayer insulating film has a contact hole that reaches the diffusion region. A contact plug is disposed in the contact hole. The contact plug is connected to the diffusion region. The bit line extends over the first interlayer insulating film. The bit line is connected through the contact plug to the diffusion region.

In another embodiment, a semiconductor device may include, but is not limited to, a semiconductor substrate having a memory cell region and a peripheral circuit region. A plurality of memory cells is provided in the memory cell region. Each memory cell may include, but is not limited to, a cell transistor and a capacitor coupled to the cell transistor. A plurality of buried word lines is connected to the plurality of memory cells. A plurality of bit lines is connected to the plurality of memory cells. The plurality of bit lines extends over the memory cell region and a peripheral circuit region. A plurality of sense amplifiers is provided in the peripheral circuit region. Each sense amplifier may include, but is not limited to, a transistor having a portion of the bit line as a gate electrode.

In some cases, the gate electrode may include, but is not limited to, a polysilicon film. The buried word line may include, but is not limited to, an inner layer in contact with the first insulating film; and a refractory metal layer in contact with the inner layer.

In some cases, the bit line may include, but is not limited to, a bottom conductive film of polysilicon; and a metal film on the bottom conductive film.

In some cases, the semiconductor device may further include, but is not limited to, a first interlayer insulating film and contact plugs. A first interlayer insulating film is provided over the semiconductor substrate in the memory cell region. The first interlayer insulating film has contact holes that reach diffusion regions of the cell transistors. The contact plugs are provided in the contact holes. The contact plugs are connected to the diffusion regions. The bit lines extend over the first interlayer insulating film. The bit lines are connected through the contact plugs to the diffusion regions.

In still another embodiment, a semiconductor device may include, but is not limited to, a semiconductor substrate having a memory cell region and a peripheral circuit region; a bit line extending over the memory cell region and the peripheral circuit region, the bit line including a first portion in the peripheral circuit region; and a sense amplifier in the peripheral circuit region. The sense amplifier includes a transistor having a gate electrode which includes the first portion of the bit line.

In some cases, the semiconductor device may further include, but is not limited to, a buried word line. The buried word line includes an inner layer in contact with the first insulating film; and a refractory metal layer in contact with the inner layer.

In some cases, the inner layer may include, but is not limited to, titanium nitride. The refractory metal layer may include, but is not limited to, tungsten.

In some cases, the bit line may include, but is not limited to, a bottom conductive film of polysilicon; and a metal film on the bottom conductive film.

In some cases, the metal film may include, but is not limited to, at least one of tungsten silicide, tungsten nitride, and tungsten.

In some cases, the semiconductor device may further include, but is not limited to, a diffusion region in the memory cell region of the semiconductor substrate. A first interlayer insulating film is provided over the semiconductor substrate in the memory cell region. The first interlayer insulating film has a contact hole that reaches the diffusion region. A contact plug is provided in the contact hole. The contact plug is connected to the diffusion region. The bit line extends over the first interlayer insulating film. The bit line is connected through the contact plug to the diffusion region.

Figure 1:
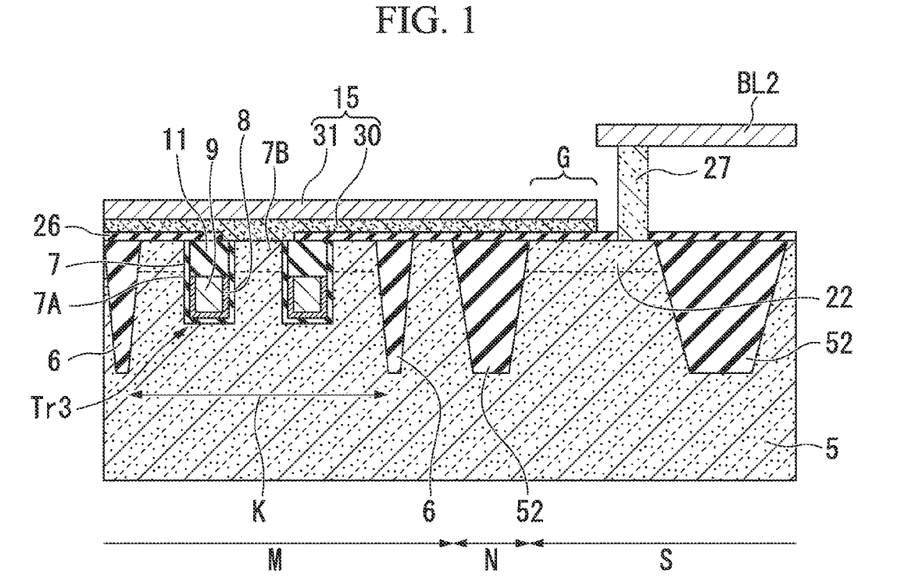
FIG. 1 is a fragmentary cross sectional elevation view of a semiconductor device, taken along a Y-Y' line of FIG. 2, in accordance with one or more embodiments of the present invention.
Figure 2:
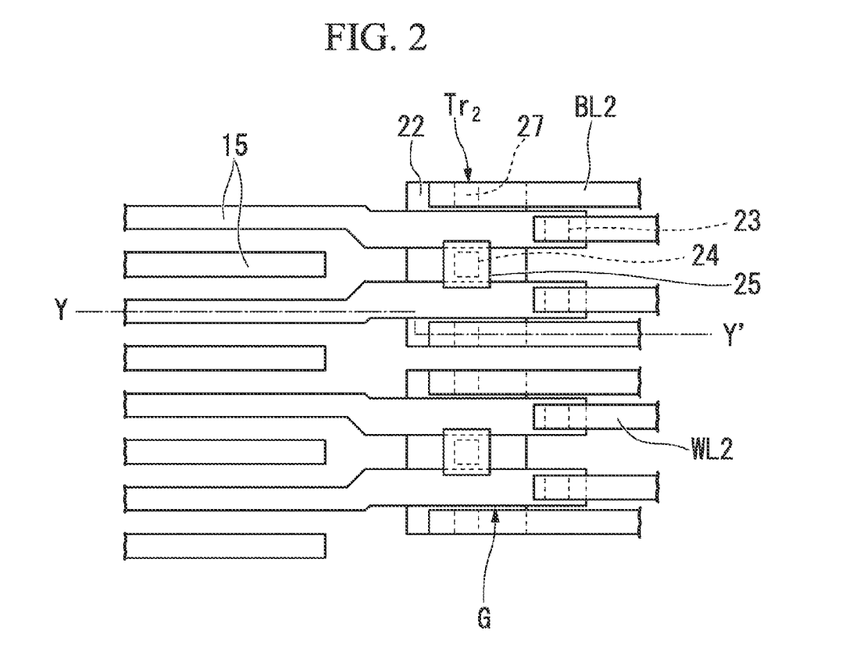
FIG. 2 is a fragmentary plan view of the semiconductor device of FIG. 1.

Embodiments of the present invention are described below, with references made to the drawings. FIG. 1 is a schematic cross-sectional view of a semiconductor device, and FIG. 2 is a schematic plan view of the semiconductor device of FIG. 2. FIG. 1 is a schematic cross-sectional view along the line Y-Y' shown in the schematic plan view of FIG. 2.

As shown in FIG. 1, the semiconductor device of the present embodiment has a semiconductor substrate 5, a peripheral circuit region S formed on the semiconductor substrate 5, and a memory cell region M formed on the semiconductor substrate, adjacent to the peripheral circuit region S. The memory cell region M and the peripheral circuit region S are partitioned by an element separation region 52 provided in a boundary region N.

A sense amplifier (not shown) is provided in the peripheral circuit region S. As shown in FIG. 2, a MOS transistor Tr2 for the sense amplifier that forms a part of the sense amplifier is provided in the peripheral circuit region S.

Referring to FIG. 1, a plurality of semiconductor storage elements are provided in the memory cell region M.

A DRAM element is an exemplary semiconductor storage element, and the DRAM element is constituted by a memory cell selection MOS transistor TR3 and a capacitor that is not shown.

A first bit line 15 that is connected to the memory cell selection MOS transistor Tr3 extends up to the peripheral circuit region S, and in the peripheral circuit region S this first bit line 15 is made to serve as the gate electrode G of the sense amplifier MOS transistor Tr2.

In the memory cell region M, as shown in FIG. 1 and FIG. 2, a word line 9 of the memory cell selection MOS transistor Tr3 is buried in the semiconductor substrate 5, and the first bit line 15 of the memory cell selection MOS transistor Tr3 is formed on one surface 5a of the semiconductor substrate 5. As shown in FIG. 1 and FIG. 2, the memory cell region M is provided with an active region K and an impurity diffusion region 7B formed on the surface of the active region K partitioned by a second element separation region 6. The word line 9 (buried word line) is buried inside the active region K, and the first bit line 15 is formed on the semiconductor substrate 5 so as to extend in a direction that intersects with the word line 9. The first bit line 15 passes the boundary region N and extends up to the peripheral circuit region S.

In the present embodiment, the first bit line 15, as will be described later, is constituted by a bottom part conductive film 30 made of a polysilicon film, and a metal film 31 made by lamination of a tungsten silicide film, a tungsten nitride film, and a high melting point metal such as a tungsten film. Additionally, the first bit line 15 has an overall three-layer structure with a silicon oxide film or the like laminated on the top thereof.

In the peripheral circuit region S, the sense amplifier MOS transistor Tr2, which forms a part of the sense amplifier, is constituted by the gate electrode G made from the end part of the first bit line 15, and an impurity diffusion region 22 formed over the semiconductor substrate on both sides in the gate length direction of the gate electrode G. The gate electrode G, in the same manner as the first bit line 15, is constituted by a film laminate of a bottom part conductive film made of a polysilicon film, a tungsten silicide film, a tungsten nitride film, and a high melting point metal film such as a tungsten film. The peripheral interconnect WL2 is connected to the gate electrode G (first bit line 15) via a first contact plug 23. A second contact plug 24 is connected to the impurity diffusion region 22, and the second contact plug 24 is connected to the interconnect layer 25 on the upper side. A third contact plug 27 is connected to the impurity diffusion region 22, and the third contact plug 27 is connected to a second bit line BL2.

In this manner, in the present embodiment the first bit line 15 is constituted by a film laminate made of the bottom part conductive layer 30 made of a polysilicon film, and a metal film 31 made of a tungsten silicide film, a tungsten nitride film, and a high melting point metal film such as a tungsten film. Because this constitution is a poly-metal structure, it is possible to use a constitution that is the same as the gate electrode of the transistor Tr2 formed in the peripheral circuit region S. Therefore, it is possible to cause the first bit line 15 of the memory cell extend as is up to the peripheral circuit region and be used as the gate electrode of the sense amplifier transistor Tr2.

Because the first bit line 15 passes the boundary region N and extends up to the peripheral circuit region S, and also the end part of the bit line 15 is made the gate electrode G of the sense amplifier MOS transistor Tr2 in the peripheral circuit region S, it is not necessary as in the past to have a connecting interconnect and contact plug for the purpose of connecting the first bit line 15 in the memory cell region M and the gate electrode G of the MOS transistor Tr2 of the peripheral circuit region S.

Additionally, if the metal film 31 of the above-noted constitution is disposed directly on the surface of the semiconductor substrate, the tungsten silicide film exhibits local abnormal growth and reaches the impurity diffusion region 7B formed on the surface of the semiconductor substrate 5, thereby causing junction destruction. Alternatively, even if destruction is not reached, there could be a condition of proximity. There is the problem that such a condition increases the junction leakage current and causes a deterioration of the performance as a semiconductor storage element.

In the present embodiment, however, because in the active region K the first bit line 15 connected to an impurity diffusion region 7B formed on the surface of the semiconductor substrate 5 is made of a poly-metal structure, there is connection of the metal film 31 to the impurity diffusion region 7B via the polysilicon film 30. Therefore, even if the tungsten silicide film of the metal film 31 is formed deeply because of an abnormal reaction, because volume of the silicon reacting with the tungsten is only increased to the extent of the thickness of the polysilicon film 30, it is possible to avoid the problem of an increase in the junction leakage current.

The details of the memory cell region M will be described, making reference to FIG. 3, FIG. 4A, and FIG. 4B. The present invention is not, however, restricted to the constitution described below. The description to follow is for the case in which, in the memory cell, an element separation region that separates a band-shaped active region in the length direction is formed by the method of voltage application by a dummy electrode. As shown in FIG. 1, the element separation region 6 may be formed within the memory cell 6 simultaneously with the peripheral circuit region element separation region 52, using STI (shallow trench isolation).

Figure 3:
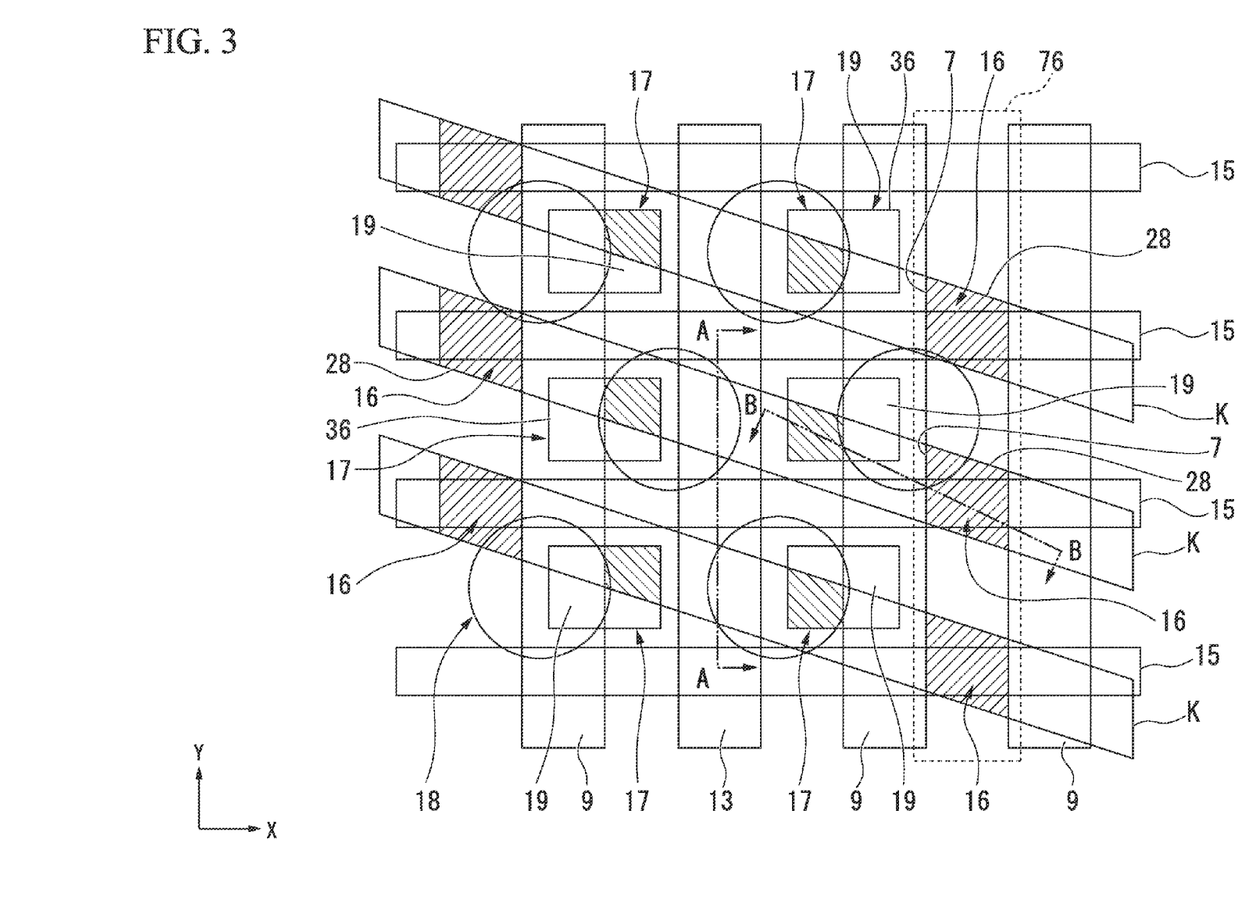
FIG. 3 is a fragmentary plan view of a memory cell region of the semiconductor device of FIG. 1.
Figure 4A:
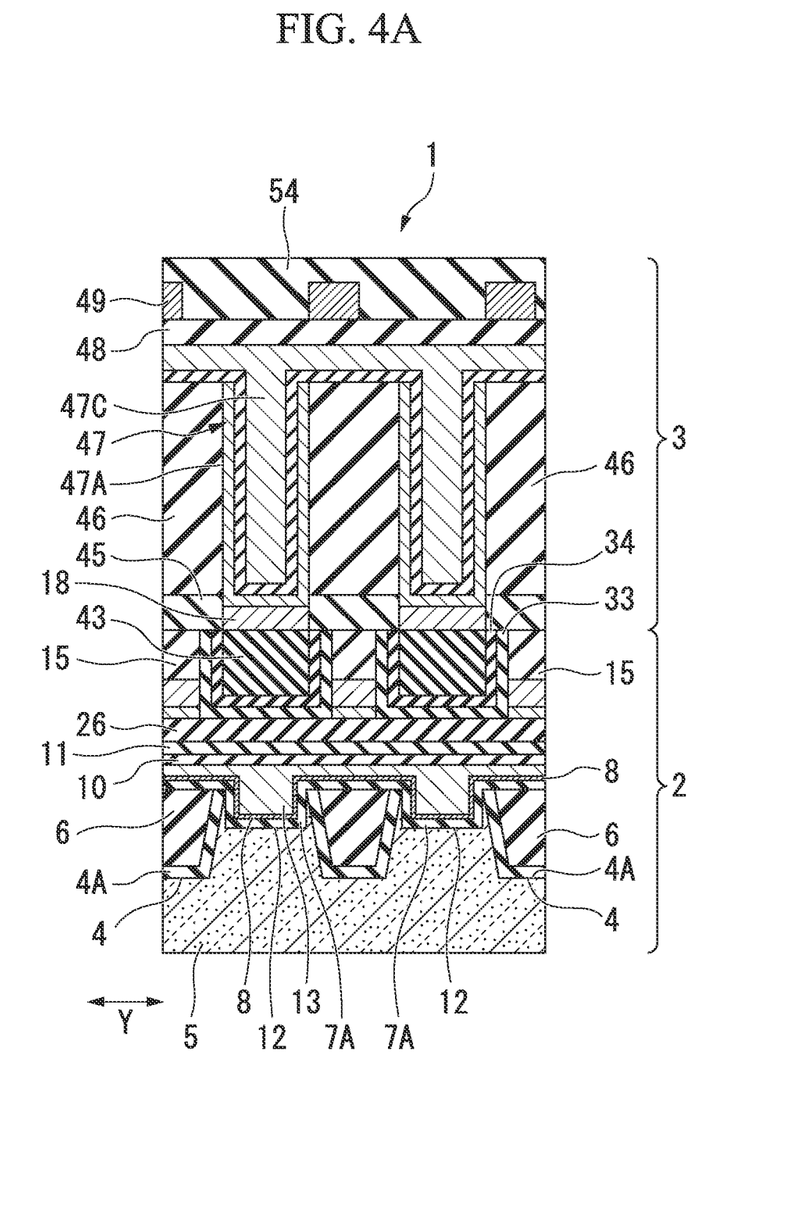
FIG. 4A is a fragmentary cross sectional elevation view of the semiconductor device, taken along an A-A' line of FIG. 3, in accordance with one or more embodiments of the present invention.
Figure 4B:
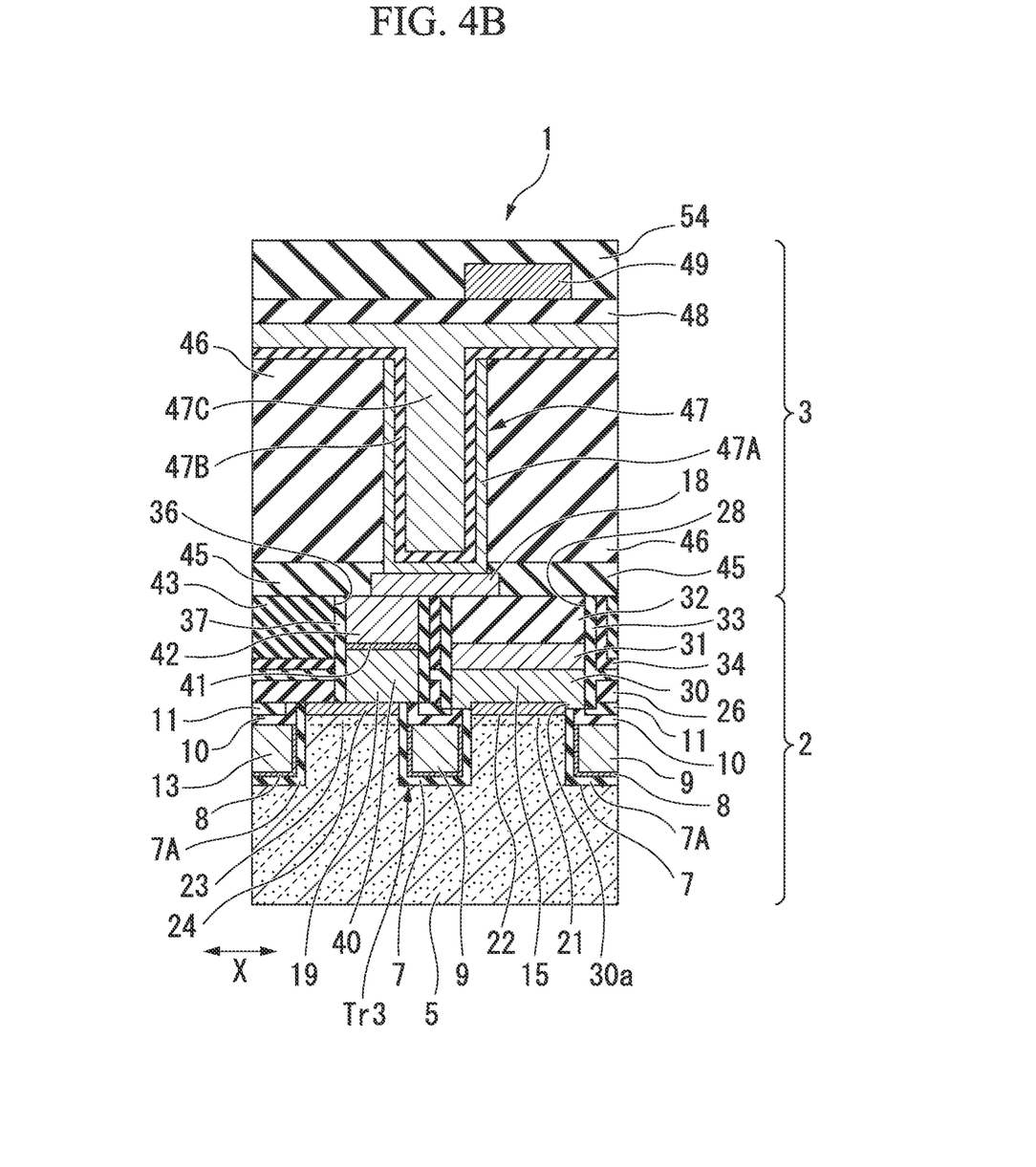
FIG. 4B is a fragmentary cross sectional elevation view of the semiconductor device, taken along a B-B' line of FIG. 3, in accordance with one or more embodiments of the present invention.

FIG. 3 and FIG. 4 are enlarged views of the memory cell region M. FIG. 3 is an enlarged plan view of the memory cell region M, FIG. 4A is a drawing showing a partial cross-sectional structure of the memory cell region M, showing the cross-sectional structure along the line A-A' in FIG. 3, and FIG. 4B shows the cross-sectional structure along the line B-B' in FIG. 3.

As shown in FIG. 3 to FIG. 4B, a DRAM element 1 that includes a memory cell selection MOS transistor Tr3 is formed in the memory cell region M. The DRAM element 1 is formed over the cell transistor formation region 2 and the cell capacitor formation region 3 shown in the cross-sectional structure of FIG. 4A and FIG. 4B.

As shown in FIG. 3 to FIG. 4B, in the transistor formation region 2, band-shaped active regions K are formed on a surface (one surface) of the semiconductor substrate 5, and a plurality of element separation regions 4 are formed at a prescribed spacing and having the cross-sectional shape shown in FIG. 4A, so as to partition these active regions K. An internal insulating film 4A made of a silicon oxide film is formed on the inner surface of the element separation regions 4, and element separation regions 6 made of silicon nitride films are formed on the inside thereof, to form the second element separation region (STI region) shown in FIG. 1.

A plurality of gate electrode trenches 7 (trenches) such as shown in FIG. 4B extending in the Y direction of FIG. 3 are formed with a prescribed spacing in the X direction of FIG. 3 and FIG. 4 (B), a gate insulating film 7A made of a silicon oxide film being formed on the inner surface of these gate electrode trenches 7, and a word line 9 made of a high melting point metal such as tungsten being formed on the inside thereof, via an inner surface layer 8 made of titanium nitride or the like. A buried insulating film 11 is formed thereover, via a liner film 10, so as to bury the gate electrode trench 7.

In FIG. 3, the gate electrode trench in which the word line 9 is formed constitutes a channel of the memory cell selection transistor Tr3 in the part in which there is overlapping with the active region K. A shallow trench that relatively shallow compared to the trench formed in the active region K is formed in the STI region adjacent to the active region K. These two types of trenches with different depths are buried, and word line 9 is formed as an interconnect having a flat continuous upper surface. Of the word line 9, the part that overlaps with the active region K is the gate electrode of the transistor Tr3.

In the regions between the element separation trenches 4, 4 such as shown in FIG. 4 (A), channel trenches 12 that are shallower than the element separation trench 4 are formed, the gate insulating film 7A being formed on the inner surfaces of these channel trenches 12 and on the upper surfaces of the element separation regions 4 that are adjacent to the channel trenches 12, a buried interconnect 13 for element separation being formed on the gate insulating film 7A via the inner surface layer 8, and the liner film 10 and the buried insulating film 11 being laminated over the buried interconnect 13.

The buried interconnect 13 is a film formed simultaneously with the word line 9. The buried interconnect 13 for element separation has the function of electrically separating the source regions and the drain regions (impurity diffusion regions formed on both sides of the buried interconnect 13 for element separation shown in FIG. 3) of the each of the adjacent transistors in the line-shaped active region. The buried interconnect 13 for element separation may be formed not simultaneously with the word line, but rather by forming a trench simultaneously with the element separation region 4 and burying an insulating film, using the STI method.

The first bit lines 15 are arranged as shown in FIG. 3 in a direction that is perpendicular to the direction of the arrangement of the word lines and the buried interconnects 13. Therefore, band-shaped active regions K are formed at an inclination having a prescribed angle with respect to the direction of extension of the word lines 9 and the first bit lines 15. Because the active regions K are formed on the surface of the semiconductor substrate 5, a bit line connection formation region 16 is partitioned in a part of the active region K positioned below each of the first bit lines 15. In the case in which the interconnect structure as shown in FIG. 3 is seen in plan view, in a region that is between adjacent word lines 9 in the X direction and buried interconnects 13 for element separation and between adjacent first bit lines 15, 15 in the Y direction, a capacitor contact plug formation region 17 is partitioned in a part that the active region K exists.

Capacitor contact pads 18 are formed so as to be arranged in a staggered manner in the Y direction as shown in FIG. 3 with respect to the capacitor contact plug formation regions 17. The capacitor contact pads 18 are disposed between the first bit lines 15, 15 that are along the X direction and adjacent in the Y direction in FIG. 3, and are repeatedly disposed in staggered fashion with their center parts above every other word line 9 along the Y direction or above the side of every other word line 9 along the Y direction, or stated in different terms, are disposed in a zig-zag arrangement in the Y direction.

The capacitor contact plugs 19 formed in the capacitor contact plug formation regions 17 are formed rectangle in the present embodiment as shown in FIG. 3, with one part thereof being positioned above each of the word lines 9, and another part thereof disposed in a region that is between adjacent first bit lines 15, 15 and above the area between the a word line 9 and a buried interconnect 13 for element separation, each being connected to a capacitor 47.

To describe the cell transistor formation region 2 further based on FIG. 4A and FIG. 4B, in a region that is on the surface side of the semiconductor substrate 5 positioned between word lines 9 adjacent in the X direction as shown in FIG. 4B and corresponding to the active region K, a low-concentration impurity diffusion region 21 (impurity diffusion region) and a high-concentration impurity diffusion region 22 (impurity diffusion region) are formed in this sequence from the deep side, and in a region that is on the surface side of the semiconductor substrate 5 positioned between word lines 9 adjacent in the Y direction as shown in FIG. 4B and the buried interconnect 13 for element separation, and corresponding to the active region K, a low-concentration impurity diffusion region 23 (impurity diffusion region) and a high-concentration impurity diffusion region 24 (impurity diffusion region) are formed in this sequence from the deep side. The formation of the high-concentration impurity diffusion region 24 may be omitted. The bottom surfaces of the low-concentration impurity diffusion region 21 and the low-concentration impurity diffusion region 23 are the junction surfaces. It is desirable that the depth of the junction surface from the surface of the semiconductor substrate be 30 to 50 nm.

A first interlayer insulating film 26 is formed in the region shown in FIG. 4A so as to cover over the buried insulating film 11 in the region shown in FIG. 4B on the surface of the semiconductor substrate 5, that is, over the high-concentration impurity diffusion regions 22 and 24, and so as to cover over the gate electrode trench 7 in which the word line 9, the liner layer 10, and the buried insulating film 11 are formed.

With respect to the first interlayer insulating film 26, a contact hole 28 is formed in a region between gate electrode trenches 7, 7 adjacent in the X direction of FIG. 4B, and a first bit line 15 extending in a direction that is perpendicular to the word line 9 as shown in FIG. 3 is formed over the first interlayer insulating film 26, these first bit lines 15 being formed to extend in the contact hole 28 parts up to the bottom part side of the contact hole 28, and making connection to the high-concentration impurity diffusion region 22 formed below the each of the contact holes 28. Therefore, in the region in which a contact hole 28 is formed, there is a part in which a first bit line 15 exists, and the region below which the high-concentration impurity diffusion region 22 exists is taken to be the bit line connection formation region 16.

The first bit line 15 has a three-layer structure constituted by the bottom part conductive film 30 made of polysilicon, a metal film made 31 made by the sequential formation on the bottom part conductive film 30 of a tungsten silicide film, a tungsten nitride film, and a high melting point metal such as a tungsten film, and an upper insulating film 32 made of a silicon nitride film or the like. An insulating film 33 made of a silicon nitride film or the like and a liner film 34 are each formed so as to be positioned on both sides in the width direction of the first bit line 15 shown in FIG. 4B, above the first interlayer insulating film 26 shown in FIG. 4B, and on both sides of the first bit line 15 in the width direction. As shown in FIG. 1 and FIG. 2, the first bit line 15 extends as is up to the peripheral circuit region S, and becomes the gate electrode G of the sense amplifier MOS transistor Tr2 in the peripheral circuit region S.

The film thickness of the bottom part conductive film 30 made of polysilicon is preferably 10 to 50 nm. In the case in which it is thinner than 10 nm, it does not function as a buffering layer with respect to an abnormal silicide reaction of the tungsten silicide, and if it is greater than 50 nm, the height of the overall first bit line that includes the upper insulating film 32 becomes large, and processing becomes difficult. It is more preferably in the range from 20 to 30 nm.

The bottom part conductive film 30 that constitutes the first bit line 15 is made of an implanted polysilicon film which is impurity-doped polysilicon that is doped with an impurity such as phosphorus (P) and then further ion implanted with an impurity ion such as phosphorus (P). On both end sides of the bottom part conductive film 30 positioned on both side of the first bit line 15 in the width direction are formed protrusions 30a that protrude in the depth direction of the semiconductor substrate 5. By forming the protrusions 30a on both sides of the bottom part conductive film 30, the bottom part conductive film 30 is connected so as to surround the high-concentration impurity diffusion region 22 of the semiconductor substrate 5, thereby contributing to a reduction in the contact resistance.

Capacitor contact apertures 36 that are rectangular seen in plan view are formed in regions between the first bit lines 15 shown in FIG. 3, and extending to a region between adjacent element separation buried interconnects 13, and capacitor contact plugs 19 are formed on the inside of these capacitor contact apertures, surrounded by side walls 37 made of a silicon nitride film or the like. Therefore, the parts in which the capacitor contract apertures 36 are formed are opposite the capacitor contact plug formation regions 17.

The capacitor contact plugs 19 formed here, as shown in FIG. 4B, have a three-layer structure constituted by a bottom part conductive film 40 made of polysilicon or the like, a silicide layer 41 made of CoSi or the like, and a metal film made of tungsten or the like. The first bit line 15 and the capacitor contact plug 19 are formed to have the same height over the semiconductor substrate 5, and a buried insulating film 43 is formed so that the first bit line 15 and the capacitor contact plug 19 have the same height in other regions.

In the capacitor formation region 3 shown in FIG. 4A and FIG. 4B, the capacitor contact pads 18 having the shape as shown in FIG. 3 are formed so to partially overlap over the contact plugs 19 in a staggered manner when seen in plan view. The capacitor contact pads 18 are covered by the stopper film 45, a third interlayer insulating film 46 is formed over the stopper film 45, and the individual capacitors 47 are formed inside the third interlayer insulating film 46 and at positions above the capacitor contact pads 18.

A capacitor 47 is constituted by a cap-shaped lower electrode 47A formed over the capacitor contact pad 18, a capacitor insulating film 47B formed to extend over the third interlayer insulating film 46 from the inner surface of the lower electrode 47A, an upper electrode 47C that buries the inside of the lower electrode 47a on the inside of the capacitor insulating film 47B and is formed to extend up to the upper surface side of the capacitor insulating film 47B, a fourth interlayer insulating film 48 formed over the upper electrode 47C and an upper metal interconnect 49 formed over the fourth interlayer insulating film 48, and a protective film 54 provided so as to cover the upper metal interconnect 49 and the fourth interlayer insulating film 48. The structure of the capacitor 47 formed in the capacitor formation regions 3 is one example, and it is obvious that in addition to the structure of the present embodiment, other capacitor structures generally applied to semiconductor storage devices, such as a crown type, may be applied.

As described above, according to the semiconductor device of the present embodiment, because the first bit lines 15 extend up to the peripheral circuit region S, and bit lines 15 in the peripheral circuit region S are taken as the gate electrode G of the MOS transistor Tr2 of the sense amplifier, the conventional connecting interconnect becomes unnecessary, and it is possible to achieve a savings of space in the semiconductor device.

Also, according to the semiconductor device of the present embodiment, because the gate electrodes G of the MOS transistor s Tr2 that are parts of the first bit lines 15 are constituted to include a polysilicon film, an abnormal reaction does not occur between a single crystal silicon of the semiconductor substrate and metal that make up the semiconductor device.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
    an interlayer insulating film formed over a semiconductor substrate;
    a bit line formed on the interlayer insulating film, the bit line including a first metal layer, and a first poly-silicon layer intervening between the first metal layer and the interlayer insulating film, the first poly-silicon layer being directly connected to a bit line connection formation region of the semiconductor substrate; and
    a transistor including a gate insulating film and a gate electrode, the gate electrode including a second metal layer, and a second poly-silicon layer intervening between the second metal layer and the gate insulating film;
    wherein a space between the first metal layer and the interlayer insulating film is substantially equal to a space between the second metal layer and the gate insulating film so that the first poly-silicon layer is substantially equal in thickness to the second poly-silicon layer, and the first poly-silicon layer has protrusions that protrude in the depth direction of the semiconductor substrate so as to surround the bit line connection formation region.

2. The device as claimed in claim 1, wherein the bit line and the gate of the transistor are electrically connected to each other.

3. The device as claimed in claim 1, wherein the bit line is elongated to provide an elongated portion, and the elongated portion serves as the gate electrode of the transistor.

4. The semiconductor device according to claim 1, wherein each of the first and second metal layers comprises a refractory metal silicide layer.

5. The semiconductor device according to claim 4, wherein the refractory metal silicide layer comprises tungsten silicide.

6. The semiconductor device according to claim 1, wherein each of the first and second metal layers comprises a refractory metal nitride layer.

7. The semiconductor device according to claim 6, wherein the refractory metal nitride layer comprises tungsten nitride.

8. The semiconductor device according to claim 1, wherein each of the first and second metal layers comprises a refractory metal layer.

9. The semiconductor device according to claim 8, wherein the refractory metal layer comprises tungsten.

10. The semiconductor device according to claim 1, wherein each of the first and second metal layers comprises a tungsten silicide layer, a tungsten nitride layer, a tungsten layer.

11. The semiconductor device according to claim 10, wherein the tungsten layer formed over the tungsten nitride layer, and the tungsten nitride layer formed over the tungsten silicide layer.

12. A semiconductor device comprising a bit line formed on an interlayer insulating film, and a transistor including a gate insulating film, a gate electrode that is formed on the gate insulating film and is electrically connected to the bit line;
    the bit line comprising a first poly-silicon layer having a top surface and a bottom surface that is in direct contact with the interlayer insulating film, a first metal layer that is in direct contact with the top surface of the first poly-silicon layer, the first poly-silicon layer having a first thickness defined between the top and bottom surfaces thereof, the first poly-silicon layer being directly connected to a bit line connection formation region of the semiconductor substrate; and the gate electrode comprising a second poly-silicon layer having a top surface and a bottom surface that is in direct contact with the gate insulating film, a second metal layer that is in direct contact with the top surface of the second poly-silicon layer, the second poly-silicon layer having a second thickness defined between the top and bottom surfaces thereof, the second thickness being substantially equal to the first thickness;

wherein the first poly-silicon layer has protrusions that protrude in the depth direction of the semiconductor substrate so as to surround the bit line connection formation region.

13. The device as claimed in claim 12, wherein the first and second metal layers are substantially equal in thickness to each other.

14. The device as claimed in claim 12, wherein the bit line is elongated over an area in which the transistor is formed so that bit line and the gate electrode are continuous with each other.

15. The semiconductor device according to claim 12, wherein each of the first and second metal layers comprises a refractory metal silicide layer, a refractory metal nitride layer formed over the refractory metal silicide layer, and a refractory metal layer formed over the refractory metal nitride layer.

16. The semiconductor device according to claim 12, wherein each of the first and second metal layers comprises a tungsten silicide layer, a tungsten nitride layer formed over the tungsten silicide layer, and a tungsten layer formed over the tungsten nitride layer.

17. A semiconductor device comprising:
a semiconductor substrate having a memory cell region and a peripheral circuit region;
an interlayer insulating film formed over the memory cell region;
a bit line formed over the interlayer insulating film, the bit line including a first metal layer, and a first poly-silicon layer intervening between the first metal layer and the interlayer insulating film, the first poly-silicon layer being directly connected to a bit line connection formation region of the semiconductor substrate;
a transistor including source and drain regions selectively formed in the peripheral circuit region to define a channel region therebetween, the transistor including a gate insulating film formed on the channel region and a gate electrode formed on the gate insulating film, the gate electrode including a second metal layer and a second poly-silicon layer intervening between the second metal layer and the gate insulating film, the gate electrode electrically connected to the bit line; and
a space between the first metal layer and the interlayer insulating film being substantially equal to a space between the second metal layer and the gate insulating film so that the first poly-silicon layer is substantially equal in thickness to the second poly-silicon layer, and the first poly-silicon layer has protrusions that protrude in the depth direction of the semiconductor substrate so as to surround the bit line connection formation region.

18. The semiconductor device according to claim 17, wherein the bit line is elongated to provide an elongated portion over the peripheral circuit region, and the elongated portion serves as the gate electrode of the transistor so that the gate electrode is identical with the bit line.

19. The semiconductor device according to claim 17, wherein each of the first and second metal layers comprises a tungsten silicide layer, a tungsten nitride layer and a tungsten layer.

20. The semiconductor device according to claim 19, wherein the tungsten layer formed over the tungsten nitride layer, and the tungsten nitride layer formed over the tungsten silicide layer.

* * * * *